(12) United States Patent
Chen et al.

(10) Patent No.: US 10,935,694 B2
(45) Date of Patent: Mar. 2, 2021

(54) LIGHT CONVERSION MATERIAL WITH HIGH CONVERSION EFFICIENCY

(71) Applicant: National Tsing Hua University, Hsinchu (TW)

(72) Inventors: Hsueh-Shih Chen, Hsinchu (TW); Shih-Jung Ho, Tainan (TW)

(73) Assignee: National Tsing Hua University

( * ) Notice: Subject to any disclaimer, the term of this patent is extended or adjusted under 35 U.S.C. 154(b) by 355 days.

(21) Appl. No.: 16/016,581

(22) Filed: Jun. 23, 2018

(65) Prior Publication Data

US 2019/0293842 A1 Sep. 26, 2019

(30) Foreign Application Priority Data

Mar. 23, 2018 (TW) .............................. 107110116 A

(51) Int. Cl.
*G02B 5/02* (2006.01)
*G02B 1/00* (2006.01)
(Continued)

(52) U.S. Cl.
CPC ........... *G02B 1/005* (2013.01); *G02B 5/0242* (2013.01); *G02B 5/0247* (2013.01);
(Continued)

(58) Field of Classification Search
CPC .... G02B 1/005; G02B 5/0242; G02B 5/0247; G02B 5/0268; H01L 33/502; B82Y 20/00; C09K 11/025
See application file for complete search history.

(56) References Cited

U.S. PATENT DOCUMENTS 7,358,543 B2 * 4/2008 Chua ..................... B82Y 10/00
257/81
7,768,693 B2 * 8/2010 McCarthy ............ G02B 5/0289
359/326
(Continued)

FOREIGN PATENT DOCUMENTS

CN 106147749 A 11/2016

OTHER PUBLICATIONS

Li et al. CN 106147749 A, Translation to English (from WIPO IP Portal), 11 pages, Publication Date (Nov. 23, 2016). (Year: 2016).*
(Continued)

*Primary Examiner* — Daniel Petkovsek

(57) ABSTRACT

Light scattering particles made of $TiO_2$, $BaSO_4$, $SiO_2$, or $Al_2O_3$ have been used in a QD layer of a QD-LED for enhancing luminous intensity. However, the light scatters are found to decline the light conversion efficiency of the QD layer. In view of that, the present invention particularly discloses a light conversion material with high conversion efficiency for use in the QD-LED. The light conversion material mainly comprises a polymer matrix, a plurality of 3D photonic crystals dispersed in the polymer matrix, and a plurality of quantum dots dispersed in the polymer matrix, wherein each of the plurality of 3D photonic crystals is formed by applying a self-assembly process to a plurality of polymer beads. Moreover, a variety of experimental data have proved that, this light conversion material indeed exhibits outstanding photoluminescence intensity and light conversion efficiency both superior than that of the conventionally-used QD layer.

4 Claims, 14 Drawing Sheets

(51) Int. Cl.
*H01L 33/50* (2010.01)
*B82Y 20/00* (2011.01)

(52) U.S. Cl.
CPC .......... *G02B 5/0268* (2013.01); *H01L 33/502* (2013.01); *B82Y 20/00* (2013.01)

(56) References Cited

U.S. PATENT DOCUMENTS

| | | | | |
|---|---|---|---|---|
| 8,634,137 | B2* | 1/2014 | Powers | G02B 5/0289 |
| | | | | 359/485.01 |
| 10,680,144 | B2* | 6/2020 | Yoo | H01L 33/505 |
| 2011/0273081 | A1* | 11/2011 | Koh | C03C 17/007 |
| | | | | 313/504 |
| 2014/0124369 | A1* | 5/2014 | Han | C25D 13/12 |
| | | | | 204/478 |
| 2017/0096538 | A1* | 4/2017 | Sasaki | C09D 1/00 |

OTHER PUBLICATIONS

CN106147749A—Abstract (English Translation) Nov. 23, 2016.

* cited by examiner

LIGHT CONVERSION MATERIAL WITH HIGH CONVERSION EFFICIENCY

BACKGROUND OF THE INVENTION

1. Field of the Invention

The present invention relates to the technology field of light conversion materials, and more particularly to a high-conversion-efficiency light conversion material using quantum dots as principle light conversion media.

2. Description of the Prior Art

Light-emitting diodes (LEDs) have been widely applied in various luminous devices used in human life because of having advantages of small size and long service life. Moreover, it is well known that phosphor powder is a traditional light conversion material used in the LED. However, with the advancement in development and manufacture technologies of quantum dots (QDs), it is received much attention that the QDs are adopted for being as the principle light conversion material in the LED instead of the traditionally-used phosphor powder.

FIG. 1 shows a cross-sectional side view of one QD-LED disclosed by U.S. publication No. 2017/096538 A1. From FIG. 1, it is clear that the QD-LED 1' comprises: an insulation body 14', a lead frame 12', an LED chip 10', an encapsulation member 17', and a light conversion member LC' consisting of a polymer matrix 16' and a plurality of QDs 18' dispersed in the polymer matrix 16'. It is worth noting that, a barrier layer 24' is further disposed on the polymer matrix 16' for providing a moisture blocking function. In the conventional QD-LED 1', the size of the QDs 18' is controlled to be in a range between 5 nm and 20 nm as well as 2 nm and 10 nm, such that the QDs 18' are able to simultaneously radiate red light and green light after being excited by a short-wavelength light emitted from the LED chip 10'.

It is a pity that, only a few of the short-wavelength light would be converted to the red light and the green light, but the most of the short-wavelength light directly pass through the light conversion layer LC'. FIG. 2 shows a photoluminescence (PL) spectrum of the light conversion layer. Data of FIG. 2 have indicated why the conventional QD-LED 1' has a major drawback of poor luminous uniformity. The reason is that, the intensity of the short-wavelength light is still much greater than that of the red light and the green light even if a few of the short-wavelength light are treated with a light converting process by the light conversion layer LC'. Furthermore, FIG. 3 illustrates a cross-sectional side view of another one QD-LED. For improving the luminous uniformity of the QD-LED 1', LED manufactures have made great efforts to make inventive research and eventually found that the adding of light scattering particles 19' is helpful for the improvement on the luminous uniformity of the QD-LED 1'. The light scattering particles 19' are commonly made of $TiO_2$, $BaSO_4$, $SiO_2$, or $Al_2O_3$.

Please continuously refer to FIG. 4 and FIG. 5, wherein FIG. 4 shows a graphic plot of concentration of QDs versus luminous intensity, and FIG. 5 shows a graphic plot of concentration of light scattering particles versus luminous intensity as well as conversion efficiency. From FIG. 4, it is found that, the QD-LED 1' with lwt % of the light scattering particles 19' indeed exhibits better luminous intensity than that of the QD-LED 1' without including the light scattering particles 19'. However, data provided by FIG. 5 indicate that, although the luminous intensity of the QD-LED 1' rises with the increasing of the concentration of the light scattering particles 19', the light conversion efficiency of the light conversion member LC' declines with the increasing of the concentration of the light scattering particles 19'.

From above descriptions, it is clear that how to design and manufacture a light conversion medium capable of improving the luminous intensity and uniformity of the QD-LED in the case of exhibiting an ideal light conversion efficiency has become an important issue. In view of that, inventors of the present application have made great efforts to make inventive research and eventually provided a light conversion material with high conversion efficiency.

SUMMARY OF THE INVENTION

Light scattering particles made of $TiO_2$, $BaSO_4$, $SiO_2$, or $Al_2O_3$ have been used in a QD layer of a QD-LED for enhancing luminous intensity. However, the light scatters are found to decline the light conversion efficiency of the QD layer. In view of that, the primary objective of the present invention is to disclose a light conversion material with high conversion efficiency for use in the QD-LED. The light conversion material mainly comprises a polymer matrix, a plurality of 3D photonic crystals dispersed in the polymer matrix, and a plurality of quantum dots dispersed in the polymer matrix, wherein each of the plurality of 3D photonic crystals is formed by applying a self-assembly process to a plurality of polymer beads. Moreover, a variety of experimental data have proved that, this light conversion material indeed exhibits outstanding photoluminescence intensity and light conversion efficiency both superior than that of the conventionally-used QD layer.

In order to achieve the primary objective of the present invention, the inventor of the present invention provides a first embodiment for the light conversion material with high conversion efficiency, which is used for applying a light conversion process to a short-wavelength light and comprises:

a plurality of 3D photonic crystals, being dispersed in the polymer matrix and capable of treating the short-wavelength light with the light conversion process; wherein each of the plurality of 3D photonic crystals comprises:
  a plurality of polymer beads; and
  a plurality of quantum dots, being absorbed on the surface of each of the plurality of polymer beads;
wherein each of the plurality of 3D photonic crystals is fabricated by applying a self-assembly process to the plurality of polymer beads absorbing with the quantum dots by the surface thereof.

Moreover, for achieving the primary objective of the present invention, the inventor of the present invention provides a second embodiment for the light conversion material with high conversion efficiency, which is used for applying a light conversion process to a short-wavelength light and comprises:
a polymer matrix;
a plurality of quantum dots, being dispersed in the polymer matrix; and
a plurality of light scattering units, being dispersed in the polymer matrix;
wherein each of the light scattering units is a 3D photonic crystal, and being fabricated by applying a self-assembly process to a plurality of polymer beads.

Furthermore, in order to achieve the primary objective of the present invention, the inventor of the present invention provides a third embodiment for the light conversion material with high conversion efficiency, which is used for applying a light conversion process to a short-wavelength light and comprises:
a polymer matrix;
a plurality of quantum dots, being dispersed in the polymer matrix; and
a plurality of light scattering units, being dispersed in the polymer matrix; wherein each of the light scattering units is an inverse 3D photonic crystal, and comprising:
a 3D light scattering body; and
a plurality of voids formed in the 3D light scattering body.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a light conversion material with high conversion efficiency disclosed by the present invention, embodiments of the present invention will be described in detail with reference to the attached drawings hereinafter.

First Embodiment

Figure 6:
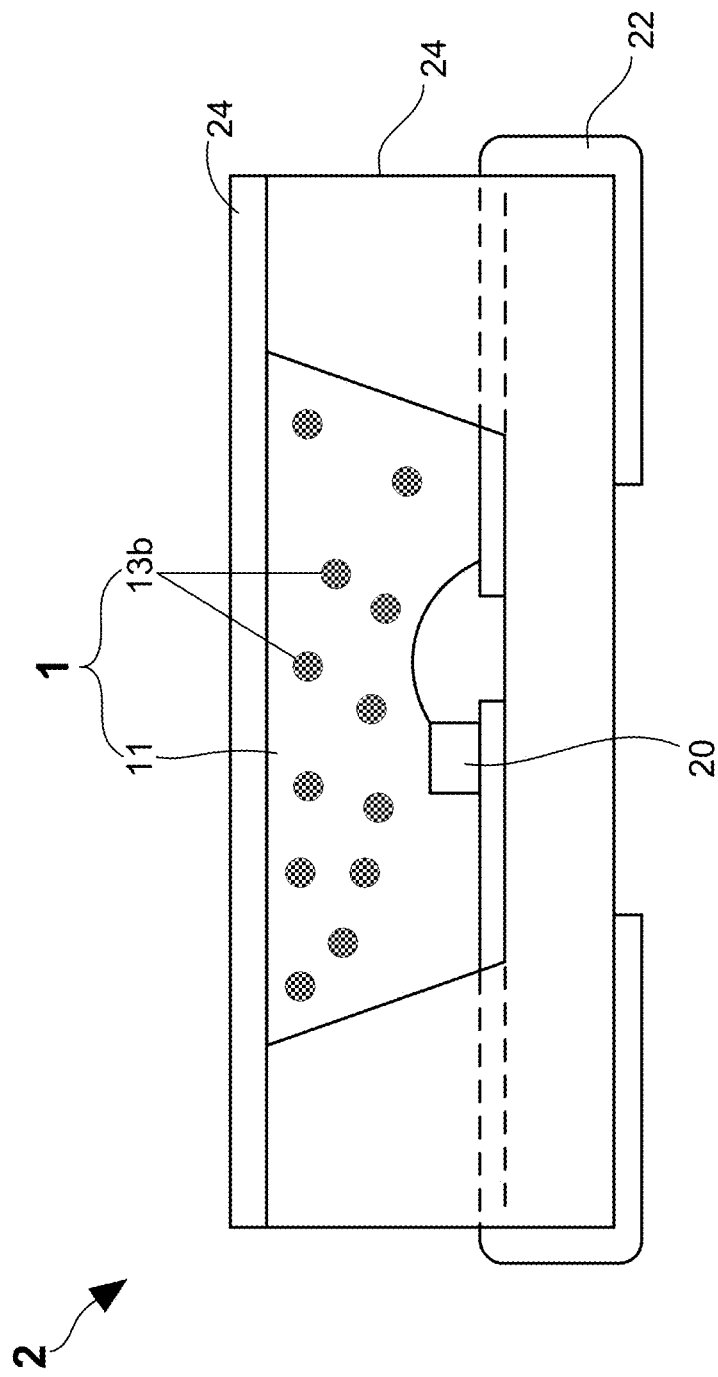
FIG. 6 shows a cross-sectional side view of a first embodiment of a QD-LED having a light conversion material of the present invention.

With reference to FIG. 6, there is provided a cross-sectional side view of a first embodiment of a QD-LED having a light conversion material of the present invention. As FIG. 6 shows, the QD-LED 2 comprises: an insulation body 24, a lead frame 22, an LED chip 20, and the proposed light conversion material 1 of the present invention. The light conversion material 1 consists of a polymer matrix 11 and a plurality of 3D photonic crystals 13b dispersed in the polymer matrix 11. In which, the said polymer matrix 11 is made of any one commercial transparent material, such as polydimethylsiloxane (PDMS), polystyrene (PS), polyethylene terephthalate (PET), polycarbonate (PC), cycloolefin co-polymer (COC), cyclic block copolymer, polylactide (PLA), polyimide (PI), and combination of any aforesaid two or above materials.

Figure 7B:
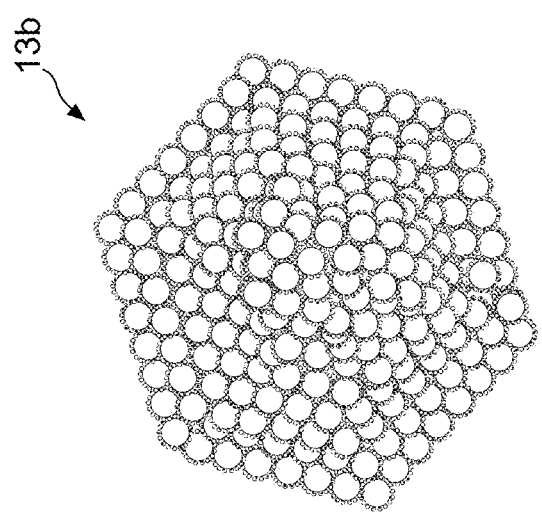
FIG. 7B shows a second stereo diagram for depicting the 3D photonic crystal.
Figure 7A:
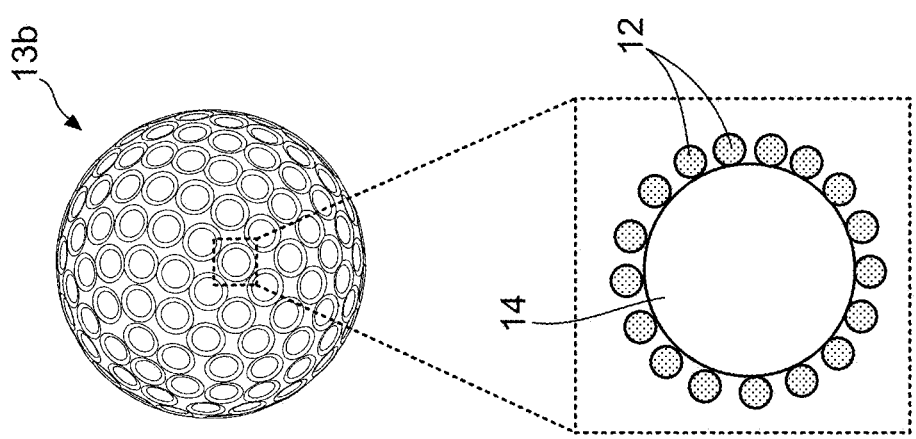
FIG. 7A shows a first stereo diagram for depicting a 3D photonic crystal.

Please continuously refer to FIG. 7A, which illustrates shows a first stereo diagram for depicting the 3D photonic crystal. In the present invention, each of the plurality 3D photonic crystals 13b is particularly design to simultaneously possess two functions of light conversion and light scattering. Moreover, the structure of each of the plurality 3D photonic crystals 13b is also particularly built by a plurality of polymer beads 14 and a plurality of quantum dots 12, wherein the quantum dots 12 are absorbed on the surface of each of the plurality of polymer beads 14, and each of the plurality of 3D photonic crystals 13b is fabricated by applying a self-assembly process to the plurality of polymer beads 14 absorbing with the quantum dots 12 by the surface thereof. Of course, the method to carry out the self-assembly process does not be limited, and can be any one practicable method such as self-assembly gravity sedimentation, electrophoretic self-assembly, or evaporation induced self-assembly.

Figure 8:
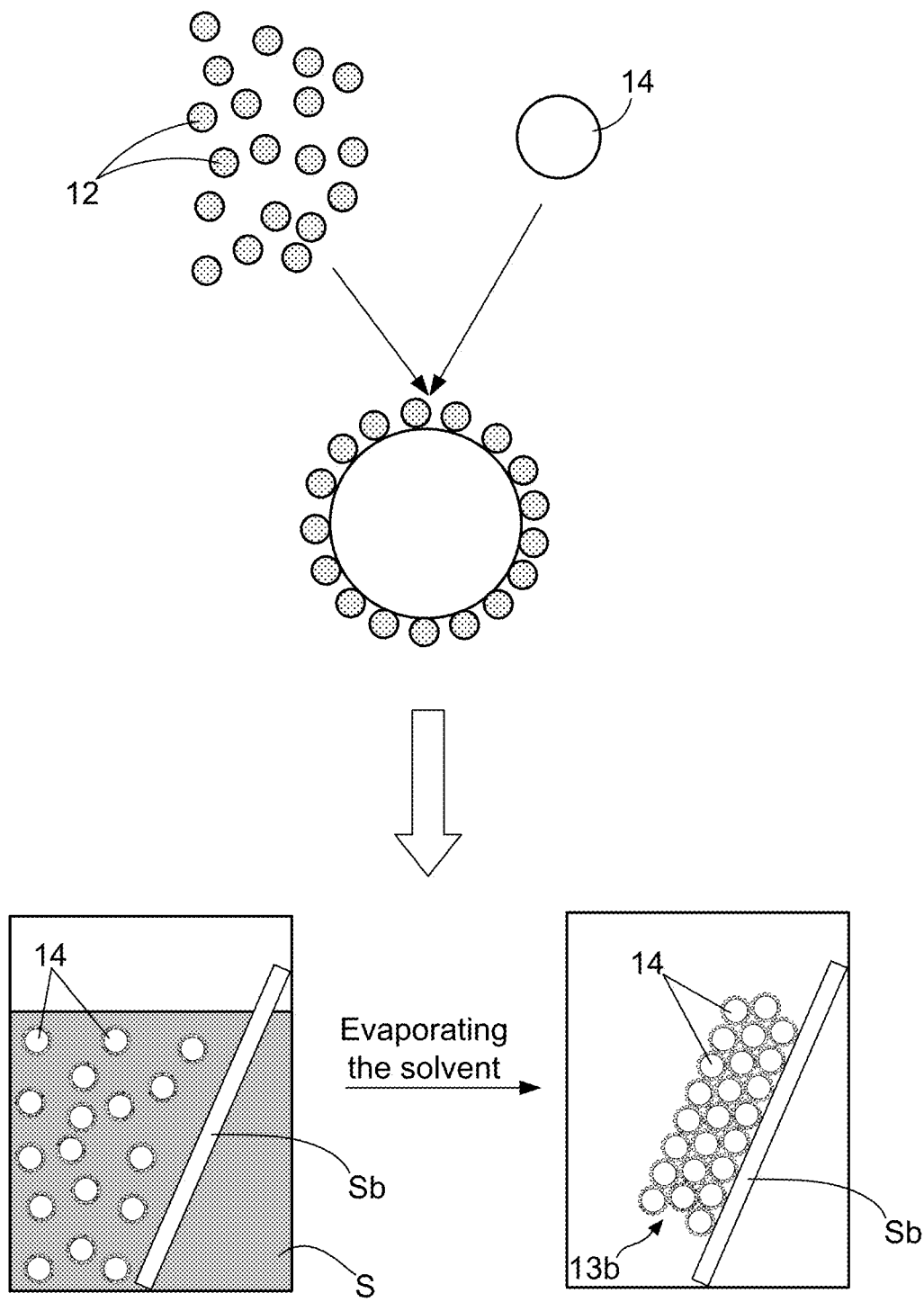
FIG. 8 shows a schematic diagram for describing a manufacturing flow of the 3D photonic crystal.

FIG. 8 provides a schematic diagram for describing a manufacturing flow of the 3D photonic crystal. With reference to FIG. 8, the manufacturing flow for fabrication the 3D photonic crystal 13b having the functions of light conversion and light scattering comprises following steps:

(1) letting a plurality of quantum dots 12 be absorbed onto the surface of a plurality of polymer beads 14;

(2) disposing the plurality of polymer beads 14 absorbing with quantum dots 12 by their surface and a solvent S (such as ethanol) into a beaker or any other one-opening container, and then slantly disposing a substrate Sb into the beaker;

(3) letting the solvent S be evaporated, and consequently a 3D photonic crystal 13b is formed after the plurality of polymer beads 14 complete an evaporation induced self-assembly.

FIG. 7B shows a second stereo diagram for depicting the 3D photonic crystal. In FIG. 7A, the 3D photonic crystal 13b is depicted to a ball-shaped photonic crystal, but that does not used for limiting the appearance or 3D shape of the 3D photonic crystal 13b. For example, by implementing a specific substrate Sb provided with particularly-designed grooves or other patterned recesses in the above-mentioned manufacturing flow, a hexagonal close-packed 3D photonic crystal 13b can be obtained on the substrate Sb after the solvent S is evaporated.

From above descriptions, it is clear that the present invention mainly develops and then proposes a specific 3D photonic crystal 13b having two functions of light conversion and light scattering, but not particularly limits the manufacturing flow, the manufacturing materials, or the structure of the 3D photonic crystal 13b. For above reason, it is also known that said polymer bead 14 can be made of any one commercial transparent material, such as polymethylmethacrylate (PMMA) or polystyrene (PS). It is worth explaining that, in order to facilitate the quantum dots 12 be absorbed onto the surface of the polymer beads 14 more easily, the polymer beads 14 made of PMMA or PS can be firstly applied with a hydrolysis treatment to form carboxyl-functionalized PMMA beads or carboxyl-functionalized PS beads before starting the step (1). On the other hand, PS beads can also be further processed to sulfonated PS beads through sulfonation treatment.

In addition, quantum dots (QDs) 12 shown in FIG. 7A can be green QDs, red QDs, or a combination of the green QDs and the red QDs. Engineers skilled in development and manufacture of QDs should know that the red QDs have a specific size in a range from 5 nm to 20 nm. Moreover, the size of the green QDs is also well-known in a range from 2 nm to 10 nm. There are conventionally-used QD materials listed in following Table (1).

TABLE 1

| Types of QD | Conventionally-used materials |
|---|---|
| Group II-VI compounds | CdSe or CdS |
| Group III-V compounds | (Al, In, Ga)P, (Al, In, Ga)As, or (Al, In, Ga)N |
| Group III-V compounds having core-shell structure | CdSe/ZnS core-shell QD |
| Group III-V compounds having core-shell structure | InP/ZnS core-shell QD |
| Group II-VI compounds having non-spherical alloy structure | ZnCdSeS |

Moreover, engineers skilled in development and manufacture of QD-LEDs should know that, the LED chip 20 shown in FIG. 6 is usually a blue LED chip, a blue-purple LED or a purple LED, and a few of a short-wavelength light emitted from the LED ship 20 would be converted to a red light and a green light by the quantum dots 12 in 3D photonic crystals 13b dispersed in light conversion material 1 over the LED chip 20. Based on such physical phenomenon, the present invention particularly determines the size of the polymer beads 14 in order to enhance the light conversion efficiency of the light conversion material 1 and the luminous uniformity of the QD-LED 2. The size of the polymer beads 14 can be determine and calculate by using flowing mathematical formula (1), wherein variables or parameters in the mathematical formula (1) are also introduced in following Table (2).

$$m\lambda = 2 \times D \times \sqrt{(n_{eff}^2 - \sin^2\theta)} \quad (1)$$

TABLE 2

| Variables/parameters | Descriptions |
|---|---|
| D | Size of the polymer bead 14 |
| λ | Wavelength of the short-wavelength light emitted by the LED chip 20. |
| m | order of diffraction |
| θ | Incident angle of the short-wavelength light for the 3D photonic crystal 13b |
| $n_{eff}$ | Equivalent refractive index of the polymer bead |

In the present invention, the said polymer beads 14 are conventional functionalized microspheres, which have been widely applied in various technology fields of drug delivery systems (DDS), bio-molecular marker systems, functional polymer paints or inks, and hybrid organic/inorganic compounds. Engineers skilled in synthesis of the functionalized microspheres should know that, there are three methods of emulsion polymerization, dispersion polymerization and suspension polymerization conventionally used for fabricating the polymer beads 14. The manufacturing flow of the dispersion polymerization method for fabricating the polymer beads 14 comprises following steps:

(1a) adding a dispersant such as polyvinylpyrrolidone (PVP), a solvent like ethanol and deionized water into a reactor;

(2a) stirring the solution in the reactor under 65° C. for 1 hour in the case of applying a water bath treatment to the reactor;

(3a) adding styrene monomers and a polymerization initiator such as azobisisobutyronitrile (AIBN) into the reactor;

(4a) stirring the solution in the reactor for 12 hours under an environment filled with nitrogen gas; and (5a) applying a centrifuging treatment to the reactor, and then screening out a plurality of PS beads from the solution of the reactor.

It is worth explaining that, the size of the PS-made polymer beads 14 correspondingly shrinks with the increasing of the concentration of the dispersant in the mixture solution of the dispersant, the solvent and the deionized water. Therefore, it is meant that the determination and control of the size of the polymer beads 14 is really practicable.

Second Embodiment

Figure 9:
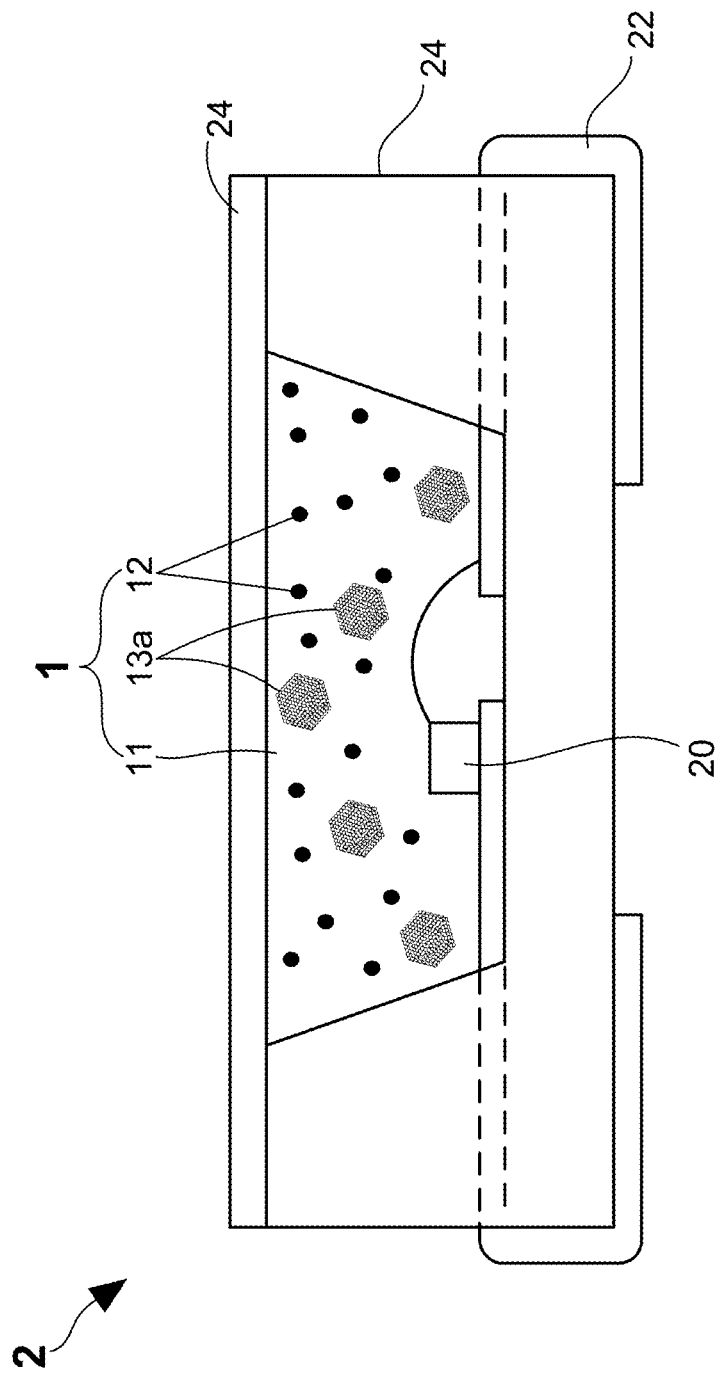
FIG. 9 shows a cross-sectional side view of a second embodiment of the QD-LED having the light conversion material of the present invention.
Figure 10:
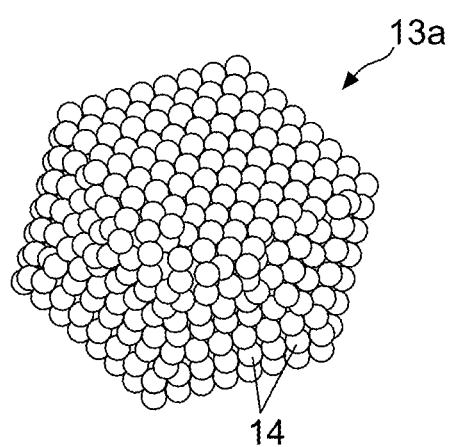
FIG. 10 shows a schematic stereo diagram for depicting a light scattering unit.

With reference to FIG. 9, there is provided a cross-sectional side view of a second embodiment of the QD-LED having the light conversion material of the present invention. As FIG. 9 shows, the QD-LED 2 comprises: an insulation body 24, a lead frame 22, an LED chip 20, and the proposed light conversion material 1 of the present invention. The light conversion material 1 consists of a polymer matrix 11 and a plurality of quantum dots 12 dispersed in the polymer matrix 11, and a plurality of light scattering units 13a dispersed in the polymer matrix 11. FIG. 10 shows a schematic stereo diagram for depicting the light scattering unit. From FIG. 9 and FIG. 10, it is understood that the said light scattering unit 13a is a 3D photonic crystal fabricated by applying a self-assembly process to a plurality of polymer beads 14.

Third Embodiment

Figure 11:
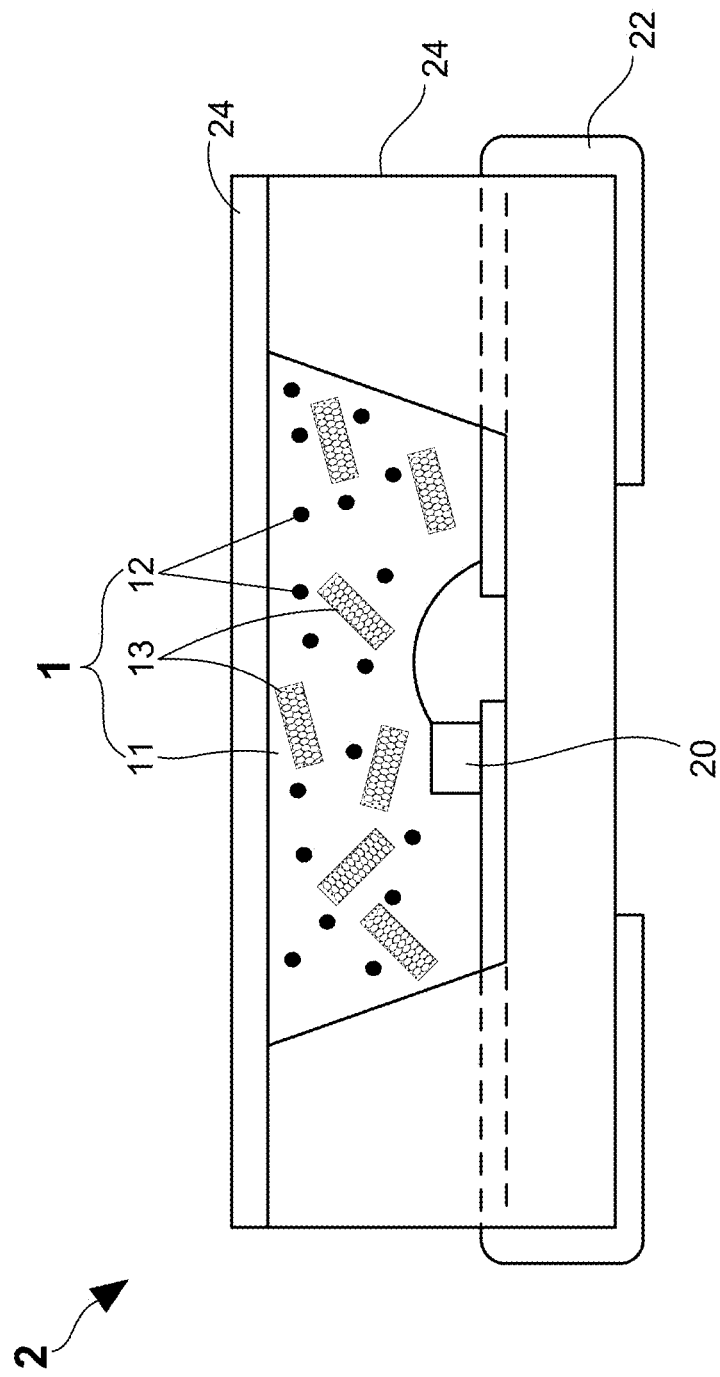
FIG. 11 shows a cross-sectional side view of a third embodiment of the QD-LED having the light conversion material of the present invention.
Figure 12:
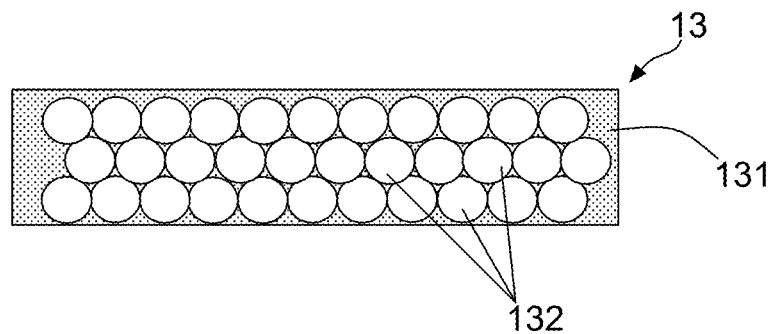
FIG. 12 shows a cross-sectional side view of the light scattering unit.

FIG. 11 shows a cross-sectional side view of a third embodiment of the QD-LED having the light conversion material of the present invention. In the third embodiment, the QD-LED 2 comprises: an insulation body 24, a lead frame 22, an LED chip 20, and the proposed light conversion material 1 of the present invention. The light conversion material 1 consists of a polymer matrix 11 and a plurality of quantum dots 12 dispersed in the polymer matrix 11, and a plurality of light scattering units 13 dispersed in the polymer matrix 11. FIG. 12 shows a cross-sectional side view of the light scattering unit. From FIG. 11 and FIG. 12, it is understood that the said light scattering unit 13 is an inverse 3D photonic crystal consists of a 3D light scattering body 131 and a plurality of voids 132 formed in the 3D light scattering body 131.

Figure 13A:
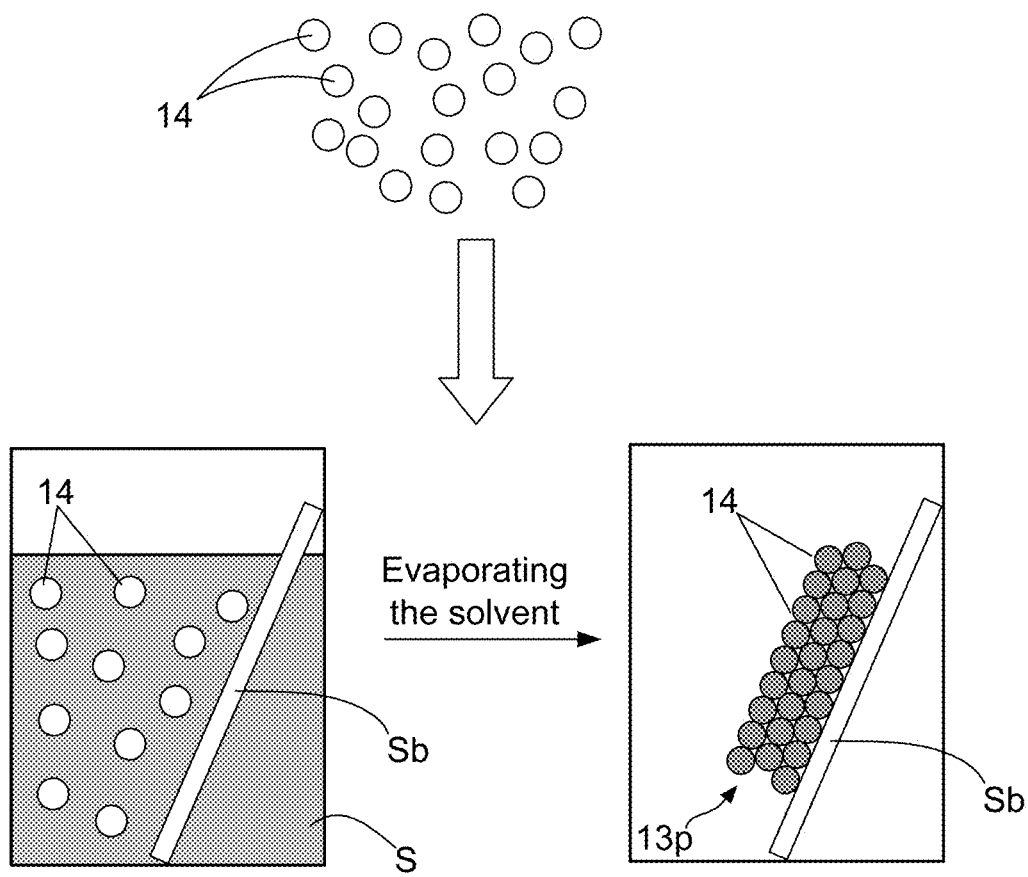
FIG. 13A and FIG. 13B show schematic diagrams for describing a manufacturing flow of the light scattering unit (inverse 3D photonic crystal)
Figure 13B:
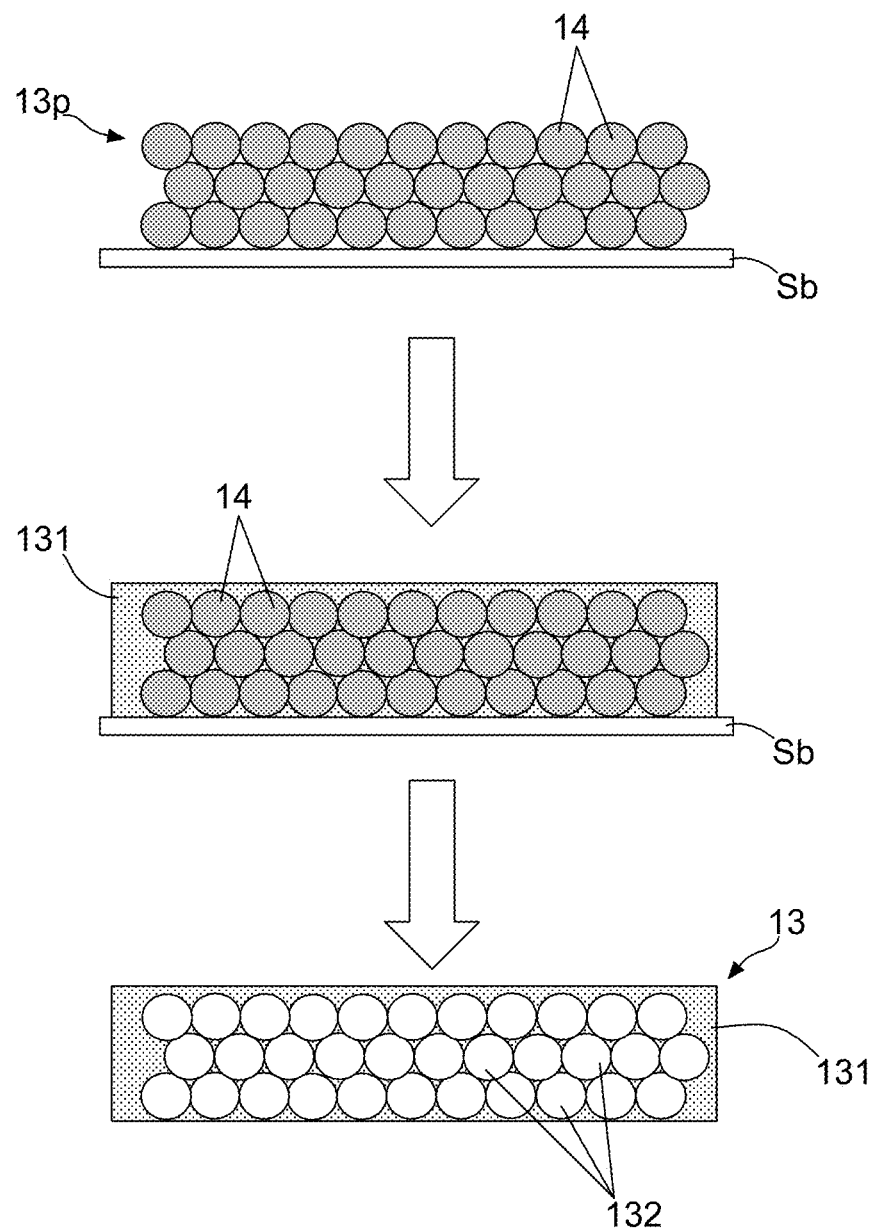

FIG. 13A and FIG. 13B provide schematic diagrams for describing a manufacturing flow of the light scattering unit (inverse 3D photonic crystal). The manufacturing flow for manufacturing the inverse 3D photonic crystal 13 comprises following steps:

(1c) providing a plurality of polymer beads 14;
(2c) adding the polymer beads 14 and a solvent such as ethanol into a beaker or any other one-opening container, and then slantly disposing a substrate Sb into the beaker;
(3c) letting the solvent S be evaporated, and then a 3D photonic crystal 13p is formed after the plurality of polymer beads 14 complete an evaporation induced self-assembly;
(4c) forming a 3D light scattering body 131 to cover the 3D photonic crystal 13p through the use of CVD or solution coating process;
(5c) applying a calcination treatment to a product of the step (4c), so as to remove the 3D photonic crystal 13p from the product;
(6c) removing the substrate Sb from a product of the step (5c);
(7c) crushing and grinding a product of the step (6c), and consequently a plurality of inverse 3D photonic crystals 13 are obtained.

It needs to further explain that the manufacturing material of the 3D light scattering body 131 is selected from the group consisting of zinc oxide (ZnO), strontium titanate ($SrTiO_3$), barium sulfate ($BaSO_4$), aluminium oxide ($Al_2O_3$), hafnium oxide ($HfO_2$), silicon oxide ($SiO_2$), zirconium dioxide ($ZrO_2$), titanium dioxide ($TiO_2$), indium oxide ($In_2O_3$), and combination of any aforesaid two or above materials.

First Verification Embodiment

Figure 2:
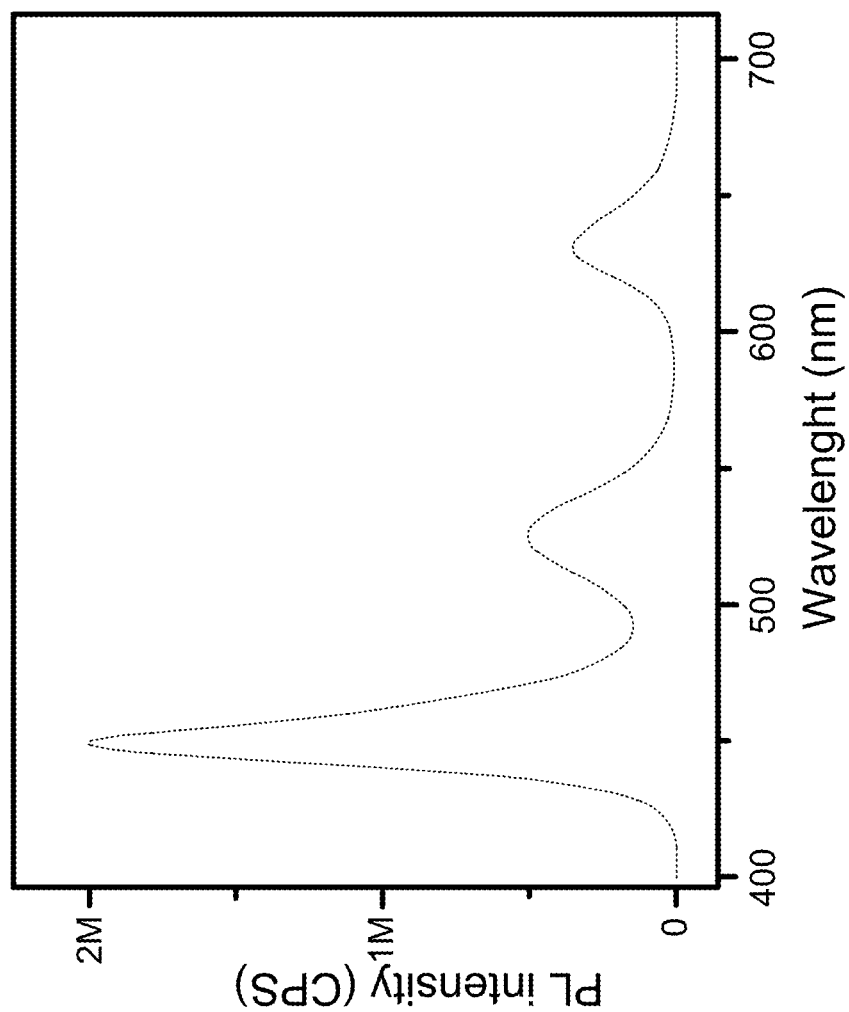
FIG. 2 shows a photoluminescence (PL) spectrum of the light conversion layer.

For verifying whether the light conversion material 1 of the present invention can provide an improvement on the light conversion efficiency of the light conversion layer LC' used in the QD-LED 1' shown as FIG. 2, inventors of the present invention plan and subsequently complete a first embodiment. There are three QD-LED samples used in first embodiment, and following Table (4) provides the information of the three samples.

TABLE 4

Figure 1:
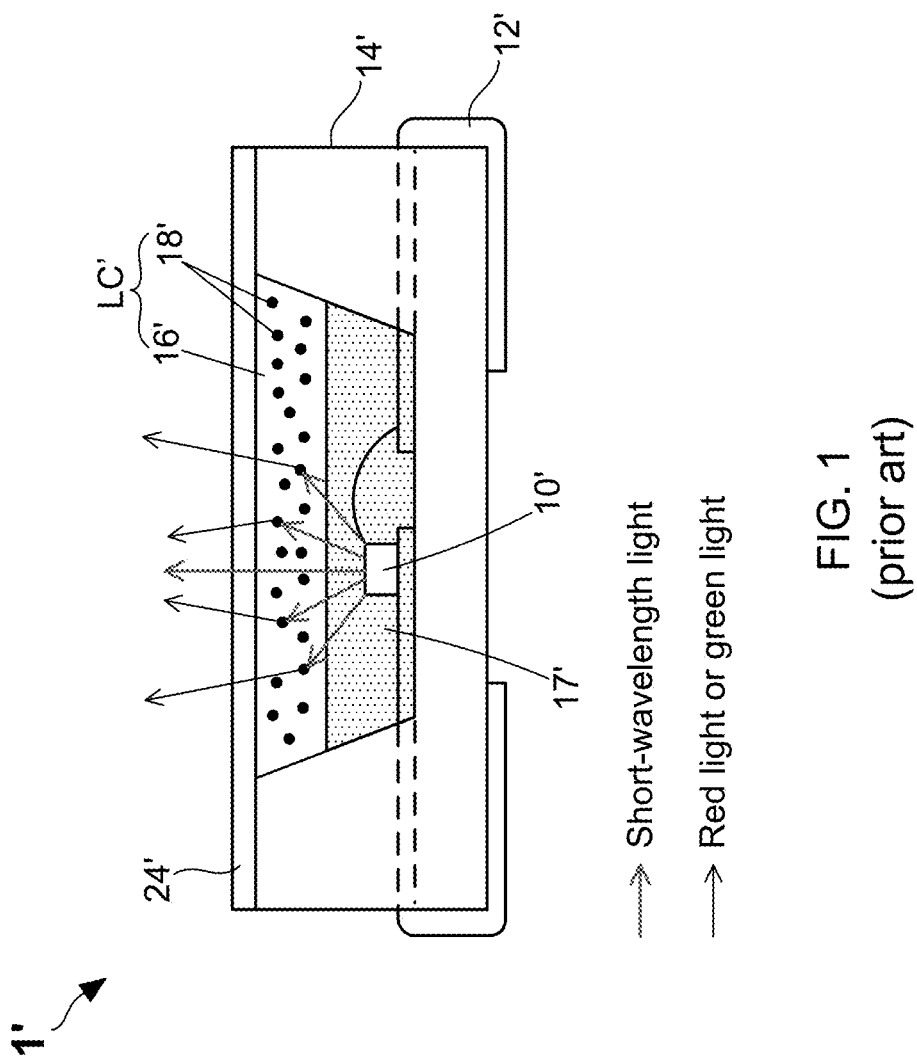
FIG. 1 shows a cross-sectional side view of one QD-LED disclosed by U.S. publication No. 2017/096538 A1.
Figure 3:
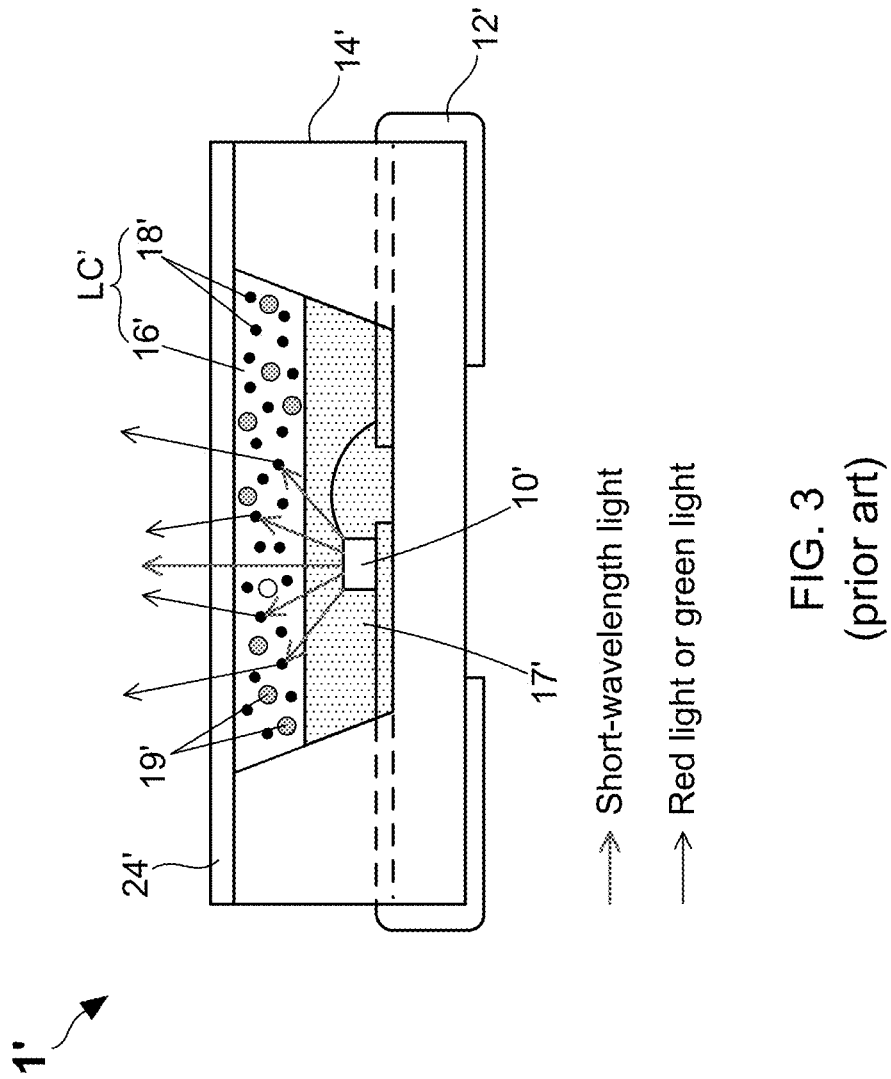
FIG. 3 shows a cross-sectional side view of another one QD-LED.
Figure 4:
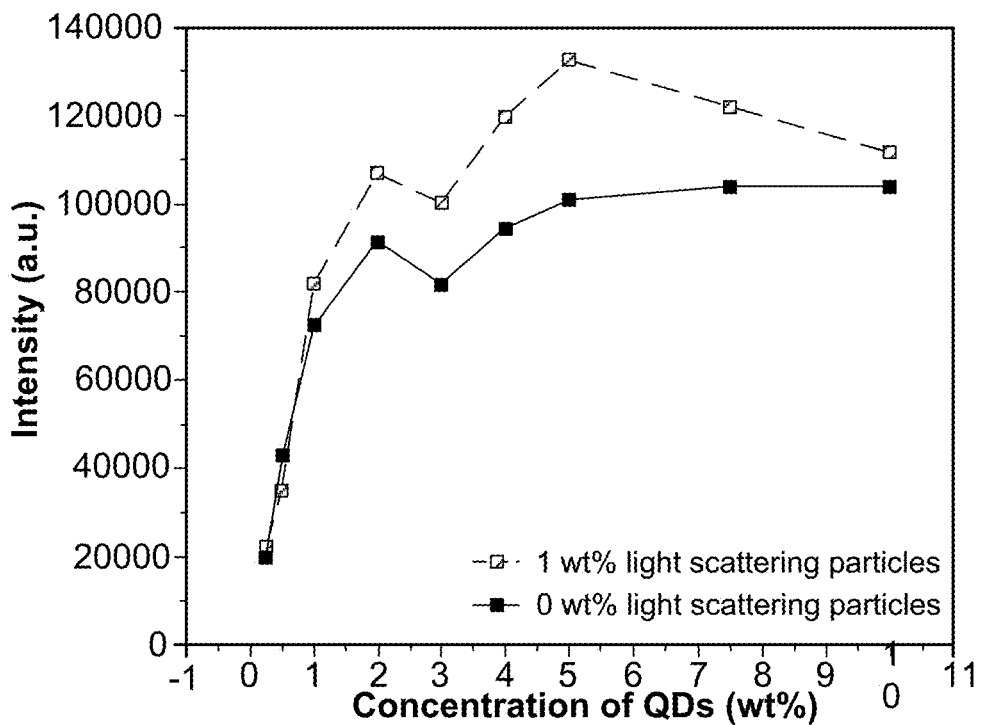
FIG. 4 shows a graphic plot of concentration of QDs versus luminous intensity.
Figure 5:
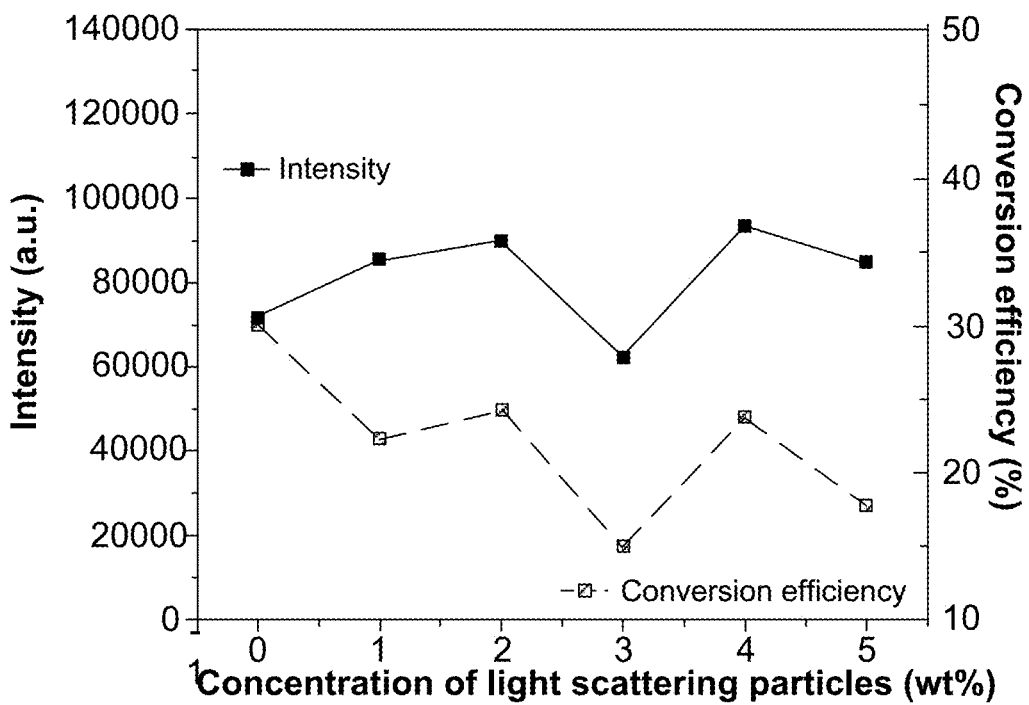
FIG. 5 shows a graphic plot of concentration of light scattering particles versus luminous intensity as well as conversion efficiency.

| Samples | Information |
|---|---|
| 1 | With reference to FIG. 1, the light conversion member LC' used in the QD-LED 1' comprises a polymer matrix 16' and a plurality of red QDs 18'. |
| 2 | With reference to FIG. 3, the light conversion member LC' used in the QD-LED 1' comprises a polymer matrix 16', and a plurality of red QDs 18', and a plurality of light scattering particles 19'. |
| 3 | With reference to FIG. 11, the third embodiment of the light conversion material 1 is applied in the QD-LED 1, and comprises: a polymer matrix 11 and a plurality of red QDs 12 dispersed in the polymer matrix 11, and a plurality of light scattering units 13 dispersed in the polymer matrix 11. |

Figure 14:
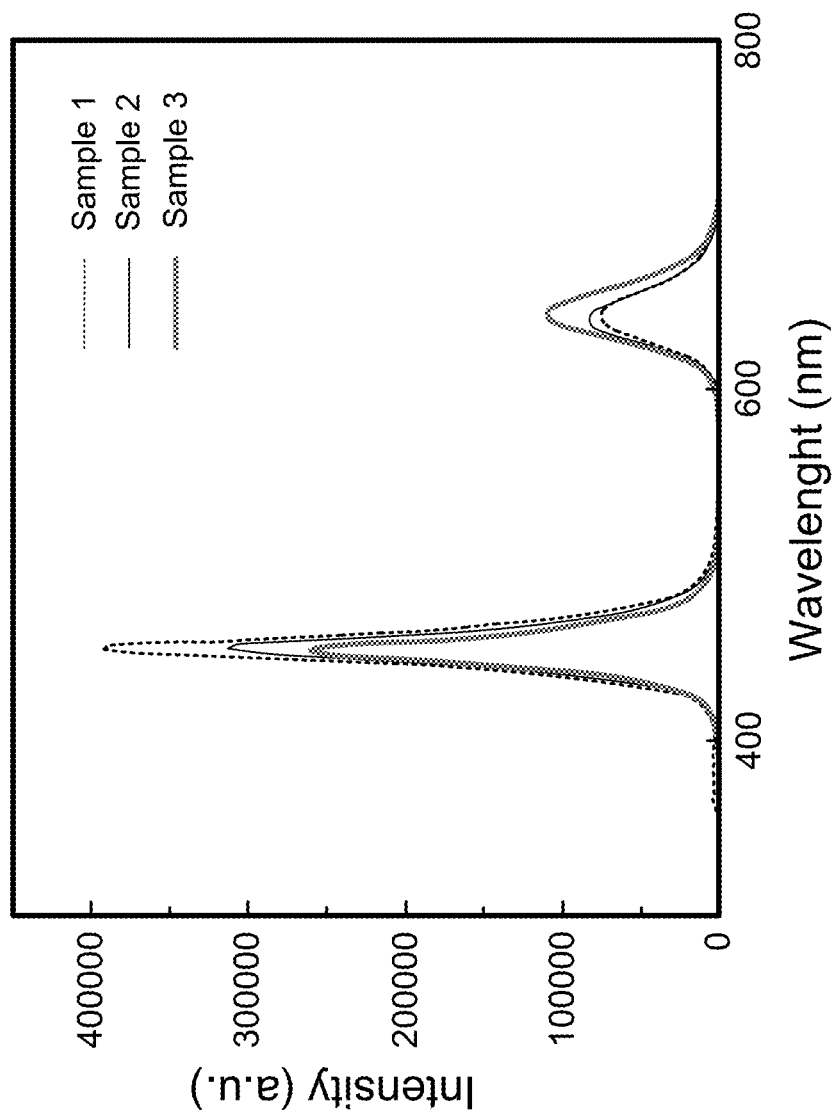
FIG. 14 shows photoluminescence (PL) spectra of three samples.

FIG. 14 shows photoluminescence (PL) spectra of the three samples. Moreover, experimental data of the three samples (1, 2, 3) measured at 630 nm are integrated in following Table (5).

TABLE 5

| Samples | PL intensity (a.u.) | Light conversion efficiency (%) |
|---|---|---|
| 1 | 72,386.89 | 28.52 |
| 2 | 81,898.91 | 26.63 |
| 3 | 100,159.58 | 31.6 |

After comparing the data of sample 1 with that of the sample 2, it is found that, the adding of the light scattering particles 19' can indeed make the light conversion member (sample 2) exhibits better PL intensity than that of the light conversion member (sample 1) including the light scattering particles 19'. However, the light conversion efficiency of the light conversion member (sample 2) tends to decline after being compared with that of the light conversion member (sample 1). On the other hand, by comparing the data of sample 3 with that of sample 2, it is understood that the light conversion member (sample 3) simultaneously exhibits better PL intensity and light conversion efficiency than that of the light conversion member (sample 2).

Second Verification Embodiment

Furthermore, a second embodiment is arranged and subsequently completed by the inventors of the present invention. There are also three QD-LED samples used in the second embodiment, and following Table (6) provides the information of the three samples.

TABLE 6

| Samples | Information |
|---|---|
| 1 | With reference to FIG. 1, the light conversion member LC' used in the QD-LED 1' comprises a polymer matrix 16' and a plurality of red QDs 18'. |
| 2 | With reference to FIG. 3, the light conversion member LC' used in the QD-LED 1' comprises a polymer matrix 16', and a plurality of red QDs 18', and a plurality of light scattering particles 19'. |
| 3a | With reference to FIG. 9, the second embodiment of the light conversion material 1 is applied in the QD-LED 1, and comprises: a polymer matrix 11 and a plurality of red QDs 12 dispersed in the polymer matrix 11, and a plurality of light scattering units 13a dispersed in the polymer matrix 11. |

Figure 15:
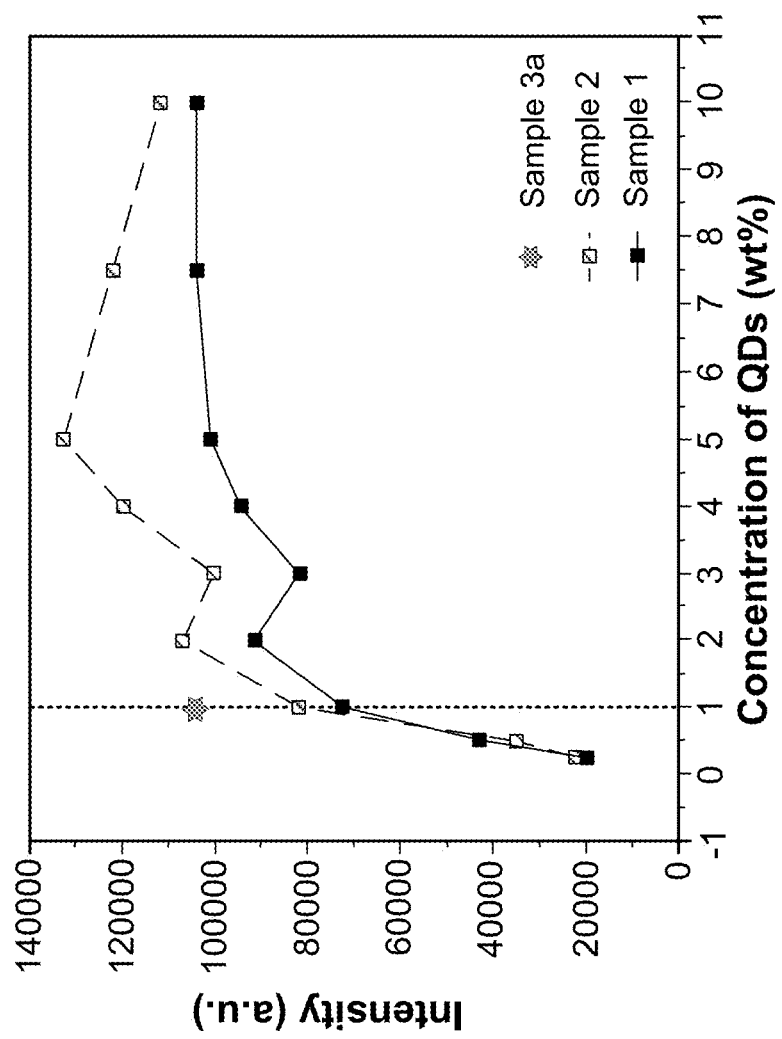
FIG. 15 shows a graphic plot of concentration of QDs versus luminous intensity.

FIG. 15 shows a graphic plot of concentration of light scattering units versus luminous intensity as well as conversion efficiency. Although the inventors only finish one data point of the sample 3a on the graphic plot, the experimental data provided by FIG. 15 are able to prove that, the second embodiment of the light conversion material 1 proposed by the present invention exhibits better PL intensity and light conversion efficiency than that of the sample 1 and sample 2.

Therefore, through above descriptions, all embodiments and their constituting elements of the light conversion material with high conversion efficiency proposed by the present invention have been introduced completely and clearly; in summary, the present invention includes the advantages of:

(1) Light scattering particles 19' made of $TiO_2$, $BaSO_4$, $SiO_2$, or $Al_2O_3$ have been used in a QD layer LC' of a conventional QD-LED 1' for enhancing luminous intensity (As FIG. 3 shows). However, the light scatters 19' are found to decline the light conversion efficiency of the QD layer LC'. In view of that, the primary objective of the present invention is to disclose a light conversion material 1 with high conversion efficiency for use in the QD-LED 2. The light conversion material 1 mainly comprises a polymer matrix 11, a plurality of 3D photonic crystals 13a dispersed in the polymer matrix 11, and a plurality of quantum dots 12 dispersed in the polymer matrix 11, wherein each of the plurality of 3D photonic crystals 13a is formed by applying a self-assembly process to a plurality of polymer beads. Moreover, a variety of experimental data have proved that, this light conversion material 1 indeed exhibits outstanding photoluminescence (PL) intensity and light conversion efficiency both superior than that of the conventionally-used QD layer LC'.

The above description is made on embodiments of the present invention. However, the embodiments are not intended to limit scope of the present invention, and all equivalent implementations or alterations within the spirit of the present invention still fall within the scope of the present invention.

What is claimed is:

1. A light conversion material, being used for applying a light conversion process to a short-wavelength light, and comprising:
   a polymer matrix; and
   a plurality of 3D photonic crystals, being dispersed in the polymer matrix and capable of treating the short-wavelength light with the light conversion process; wherein each of the plurality of 3D photonic crystals comprises:
   a plurality of polymer beads; and
   a plurality of quantum dots, being absorbed on the surface of each of the plurality of polymer beads;
   wherein the polymer beads are carboxyl-functionalized polymethyl methacrylate (PMMA) beads or sulfonated polystyrene (PS) beads;
   wherein each of the plurality of 3D photonic crystals is fabricated by applying a self-assembly process to the plurality of polymer beads absorbing with the quantum dots by the surface thereof, and being a hexagonal close-packed 3D photonic crystal.

2. The light conversion material of claim 1, wherein the manufacturing material of the polymer matrix is selected from the group consisting of polydimethylsiloxane (PDMS), polystyrene (PS), polyethylene terephthalate (PET), polycarbonate (PC), cycloolefin co-polymer (COC), cyclic block copolymer, polylactide (PLA), and polyimide (PI).

3. The light conversion material of claim 1, wherein the size of the polymer bead is calculated by using a mathematical formula of $m\lambda = 2 \times D \times \sqrt{n_{eff}^2 - \sin^2\theta}$; wherein D presents the size of the polymer bead, $\lambda$ meaning the wavelength of the short-wavelength light, m being an order of diffraction, $\theta$ presenting an incident angle of the short-wavelength light for the 3D photonic crystal, and neff meaning an equivalent refractive index of the polymer bead.

4. The light conversion material of claim 1, wherein the quantum dot is selected from the group consisting of Group II-VI compounds, Group III-V compounds, Group II-VI compounds having core-shell structure, Group III-V compounds having core-shell structure, and Group II-VI compounds having non-spherical alloy structure.

* * * * *